United States Patent [19]

Sayah

[11] Patent Number: 5,793,641
[45] Date of Patent: Aug. 11, 1998

[54] METHOD AND APPARATUS FOR PLACING AND DETECTING PREWIRE BLOCKAGES OF LIBRARY CELLS

[75] Inventor: John Youssef Sayah, North Tarrytown, N.Y.

[73] Assignee: International Business Machines Corporation, Armonk, N.Y.

[21] Appl. No.: 576,187

[22] Filed: Dec. 21, 1995

[51] Int. Cl.$^6$ .................................................. G06F 15/00
[52] U.S. Cl. .......................... 364/488; 364/489; 364/490; 364/491
[58] Field of Search .................................. 364/488–491; 382/100, 242, 243, 268, 291, 295, 307

[56] References Cited

U.S. PATENT DOCUMENTS 5,483,461  1/1996  Lee et al. .............................. 364/490
5,587,923  12/1996  Wang ..................................... 364/490

Primary Examiner—James P. Trammell
Assistant Examiner—Vuthe Siek
Attorney, Agent, or Firm—Jenkens & Gilchrist; Michael J. Balconi-Lamic; Alison Mortinger

[57] ABSTRACT

A method and apparatus for detecting valid placement of library cells on chip images or hierarchy design images may be accomplished by determining a periodic pattern of the chip image, or hierarchical image. Once the repetitive pattern is recognized, this pattern is represented by a binary vector. Similarly, a binary vector is created for a particular cell library that is to be placed on the chip image or hierarchical design image. When the placement algorithm places the library cell on the chip or hierarchical image, the binary vector of the library cell is folded over a folded binary vector of the chip image or hierarchical design image to produce a component delta set. In essence, the component delta set indicates spacing violations between the library cell and the chip or hierarchical design image. When such a spacing violation is recognized, the placement algorithm can immediately reposition the library cell.

18 Claims, 7 Drawing Sheets

IN THE X-DIRECTION (ONLY LAYER 2 APPLIES)

```
                          100                                134  VALUE
  72 OR 73                                                        OF CDS
         88  IMAGE REP (L2)   0 0 0 1 1 0 0 0 0 1 0 0 1 0 0
             CELL REP (ORG)   0 0 0 0 0 1 1 1 0 0 X X X X          0
           ┌ CELL REP (1ST)   X 0 0 0 0 0 1 1 1 0 0 X X X          1
           │ CELL REP (2ND)   X X 0 0 0 0 0 1 1 1 0 0 X X          1
           │ CELL REP (3RD)   X X X 0 0 0 0 0 1 1 1 0 0 X          1
           │ CELL REP (4TH)   X X X X 0 0 0 0 0 1 1 1 0 0          1
       136 │ CELL REP (5TH)   X X X X X 0 0 0 0 0 1 1 1 0 0        1
           │ CELL REP (6TH)   0 X X X X X 0 0 0 0 0 1 1 1 0  142 FOLD  1
           │ CELL REP (7TH)   0 0 X X X X X 0 0 0 0 0 1 1 1                1
           └ CELL REP (8TH)   1 0 0 X X X X X 0 0 0 0 0 1 1                1
       137   CELL REP (9TH)   1 1 0 0 X X X X X 0 0 0 0 0 1                0
           ┌ CELL REP (10TH)  1 1 1 0 0 X X X X X 0 0 0 0 0                1
           │ CELL REP (11TH)  0 1 1 1 0 0 X X X X X 0 0 0 0                1
       139 │ CELL REP (12TH)  0 0 1 1 1 0 0 X X X X X 0 0 0                1
           │ CELL REP (13TH)  0 0 0 1 1 1 0 0 X X X X X 0 0                1
           │ CELL REP (14TH)  0 0 0 0 1 1 1 0 0 X X X X X 0                1
           └ CELL REP (15TH)  0 0 0 0 0 1 1 1 0 0 X X X X X                1

138  RELATIVE START
       POSITION TO
       REF. POINT    0 1 2 3 4 5 6 7 8 9 10 11 12 13 14 15
       COMPONENT     0 1 1 1 1 1 1 1 1 0 1  1  1  1  1  1
  140  DELTA SET
```

FIG. 8

IN THE Y-DIRECTION (ONLY LAYER 3 IS APPLICABLE)

```
                                    100       102
74 OR 76 - IMAGE REP (L3)          0 0 0 1 1 0 0 0 0 0
      82 - CELL REP (L3Y)          0 1 1 0 0 0 X X X X
           (1ST POSITION)                          ‾‾‾‾‾
                                                   104

1ST VALUE OF
     106 - COMPONENT DELTA
           SET (CDS)               = 1                  107 — VALUE
                                                              OF CDS
           IMAGE REP               0 0 0 1 1 0 0 0 0 0
     108 - CELL REP (1ST SHIFT)    X 0 1 1 0 0 0 X X X      1
     110 - CELL REP (2ND SHIFT)    X X 0 1 1 0 0 0 X X      1
     112 - CELL REP (3RD SHIFT)    X X X 0 1 1 0 0 0 X      1
     114 - CELL REP (4TH SHIFT)    X X X X 0 1 1 0 0 0      1
126  116 - CELL REP (5TH SHIFT)    0 X X X X 0 1 1 0 0      0
FOLD 118 - CELL REP (6TH SHIFT)    0 0 X X X X 0 1 1 0      0
OVER 120 - CELL REP (7TH SHIFT)    0 0 0 X X X X 0 1 1      0
 ↓   122 - CELL REP (8TH SHIFT)    1 0 0 0 X X X X 0 1      0
     124 - CELL REP (9TH SHIFT)    1 1 0 0 0 X X X X 0      0

130
     128 - COMPONENT               0 1 2 3 4 5 6 7 8 9
           DELTA SET               1 1 1 1 1 0 0 0 0 0
```

FIG. 9

IN THE X-DIRECTION (ONLY LAYER 2 APPLIES)

| | 0 | 1 | 2 | 3 | 4 | 5 | 6 | 7 | 8 | 9 | 10 | 11 | 12 | 13 | 14 | 15 | VALUE OF CDS |
|---|---|---|---|---|---|---|---|---|---|---|---|---|---|---|---|---|---|
| IMAGE REP (L2) (72 OR 73) | 0 | 0 | 0 | 1 | 1 | 0 | 0 | 0 | 0 | 1 | 0 | 0 | 1 | 0 | 0 | | |
| CELL REP (ORG) (88) | 0 | 0 | 0 | 0 | 0 | 1 | 1 | 1 | 0 | 0 | X | X | X | X | | | 0 |
| CELL REP (1ST) | X | 0 | 0 | 0 | 0 | 0 | 1 | 1 | 1 | 0 | 0 | X | X | X | | | 1 |
| CELL REP (2ND) | X | X | 0 | 0 | 0 | 0 | 0 | 1 | 1 | 1 | 0 | 0 | X | X | | | 1 |
| CELL REP (3RD) | X | X | X | 0 | 0 | 0 | 0 | 0 | 1 | 1 | 1 | 0 | 0 | X | | | 1 |
| CELL REP (4TH) | X | X | X | X | 0 | 0 | 0 | 0 | 0 | 1 | 1 | 1 | 0 | 0 | X | | 1 |
| CELL REP (5TH) | X | X | X | X | X | 0 | 0 | 0 | 0 | 0 | 1 | 1 | 1 | 0 | 0 | | 1 |
| CELL REP (6TH) | 0 | X | X | X | X | X | 0 | 0 | 0 | 0 | 0 | 1 | 1 | 1 | 0 | | 1 |
| CELL REP (7TH) | 0 | 0 | X | X | X | X | X | 0 | 0 | 0 | 0 | 0 | 1 | 1 | 1 | | 1 |
| CELL REP (8TH) | 1 | 0 | 0 | X | X | X | X | X | 0 | 0 | 0 | 0 | 0 | 1 | 1 | | 1 |
| CELL REP (9TH) | 1 | 1 | 0 | 0 | X | X | X | X | X | 0 | 0 | 0 | 0 | 0 | 1 | | 0 |
| CELL REP (10TH) | 1 | 1 | 1 | 0 | 0 | X | X | X | X | X | 0 | 0 | 0 | 0 | 0 | | 1 |
| CELL REP (11TH) | 0 | 1 | 1 | 1 | 0 | 0 | X | X | X | X | X | 0 | 0 | 0 | 0 | | 1 |
| CELL REP (12TH) | 0 | 0 | 1 | 1 | 1 | 0 | 0 | X | X | X | X | X | 0 | 0 | 0 | | 1 |
| CELL REP (13TH) | 0 | 0 | 0 | 1 | 1 | 1 | 0 | 0 | X | X | X | X | X | 0 | 0 | | 1 |
| CELL REP (14TH) | 0 | 0 | 0 | 0 | 1 | 1 | 1 | 0 | 0 | X | X | X | X | X | 0 | | 1 |
| CELL REP (15TH) | 0 | 0 | 0 | 0 | 0 | 1 | 1 | 1 | 0 | 0 | X | X | X | X | X | 0 | 1 |

142 ↓ FOLD

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| RELATIVE START POSITION TO REF. POINT (138) | 0 | 1 | 2 | 3 | 4 | 5 | 6 | 7 | 8 | 9 | 10 | 11 | 12 | 13 | 14 | 15 |
| COMPONENT DELTA SET (140) | 0 | 1 | 1 | 1 | 1 | 1 | 1 | 1 | 1 | 0 | 1 | 1 | 1 | 1 | 1 | 1 |

METHOD AND APPARATUS FOR PLACING AND DETECTING PREWIRE BLOCKAGES OF LIBRARY CELLS

TECHNICAL FIELD OF THE INVENTION

This invention relates generally to integrated circuit design and more particularly to detection of prewire blockages of library cell placements on such integrated circuits.

BACKGROUND OF THE INVENTION

As is known, computer aided design packages are used by engineers and developers to effectively and efficiently design and lay out circuits. Such is the case for the design and layout of integrated circuits. Generally, a computer aided design package for laying out an integrated circuit includes a plurality of library cells. The library cells range in complexity from a simple logic gate, such an AND gate, NAND gate, OR gate, etc., to complex circuits, or core structures, such as central processing units, address generation units, arithmetic logic units, or memory blocks. In essence, any type of circuit that can be placed on an integrated circuit may be represented by a library cell. Such library cells typically include a wiring image of the circuit and a layout implementation structure.

As is further know, an IC manufacture provides the library cells and chip images and/or hierarchy images to an IC user such that the IC user can design its own Application Specific Integrated Circuit (ASIC). The IC user, using a computer aided placement program, the library cells, and the chip images, designs its ASIC to function in accordance with its specific needs.

For an IC user to begin laying out its ASIC, a typical computer aided design placement program starts with a chip, or base, image of an integrated circuit. The chip image includes common lines that run throughout the integrated circuit such as power supply lines, data buses, address buses, control buses, etc. Having the chip image defined, the computer aided design placement program begins to place selected library cells onto the chip image. The placement procedure is based on a plurality of functional requirements such as noise sensitivity of the circuit represented by the library cell, wire links, timing constraints, timing requirements, signal coupling, access to other circuits, etc.

While computer aided design placement programs work well to place library cells onto the chip image, they do not determine wire blockages. A wire blockage occurs when a library cell is placed over an image and a particular layer of the library cell violates spacing requirements with a corresponding layer of the chip image. The particular spacing requirements are determined by technology constraints, or by the designer, and are verified after the placement algorithm has been executed. Such spacing requirement verification processes are done using an exhaustive search which looks at the spacing between the library cells and chip images and between library cells and other library cells for each layer of the integrated circuit. If the spacing between any of the library cells are not sufficient, the designer must reposition the library cell to obtain appropriate spacing. As one would expect, this exhaustive search takes a considerable amount of time and, if it detects an error, additional time is added to the design layout of an integrated circuit.

For typical integrated circuit designs that include 100,000 or more components, a computer aided placement program may take several days to run. If an error is found during the exhaustive search, the computer aided placement program must be re-run. Adding several more days to the design of the integrated circuit.

Therefore, a need exists for a method and apparatus that determines valid placements of library cells on supporting base images while a placement algorithm is executing and eliminates the need for an exhaustive search.

BRIEF DESCRIPTION OF THE DRAWINGS

FIG. 8 illustrates a calculation procedure to determine valid cell placement of FIG. 7 in accordance with the present invention; and FIG. 9 illustrates the computations to determine an invalid cell placement of FIG. 7 in accordance with the present invention.

DETAILED DESCRIPTION OF A PREFERRED EMBODIMENT

Generally, the present invention provides a method and apparatus for detecting valid placement of library cells on chip images or hierarchy design images (base image). This may be accomplished by determining a periodic pattern of the base image. Once the repetitive pattern is recognized, this pattern is represented by a binary vector. Similarly, a binary vector is created for a particular library cell that is to be placed on the base image. When the placement algorithm places the library cell on the base image, a component delta set is created to indicate valid and invalid relative positioning of the library cell on the base image. When an invalid relative positioning is indicated, the placement algorithm can immediately reposition the library cell based on values of the component delta set to insure proper spacing. Thus, the present invention allows for on-the-fly spacing determinations during execution of a placement program.

Figure 1:
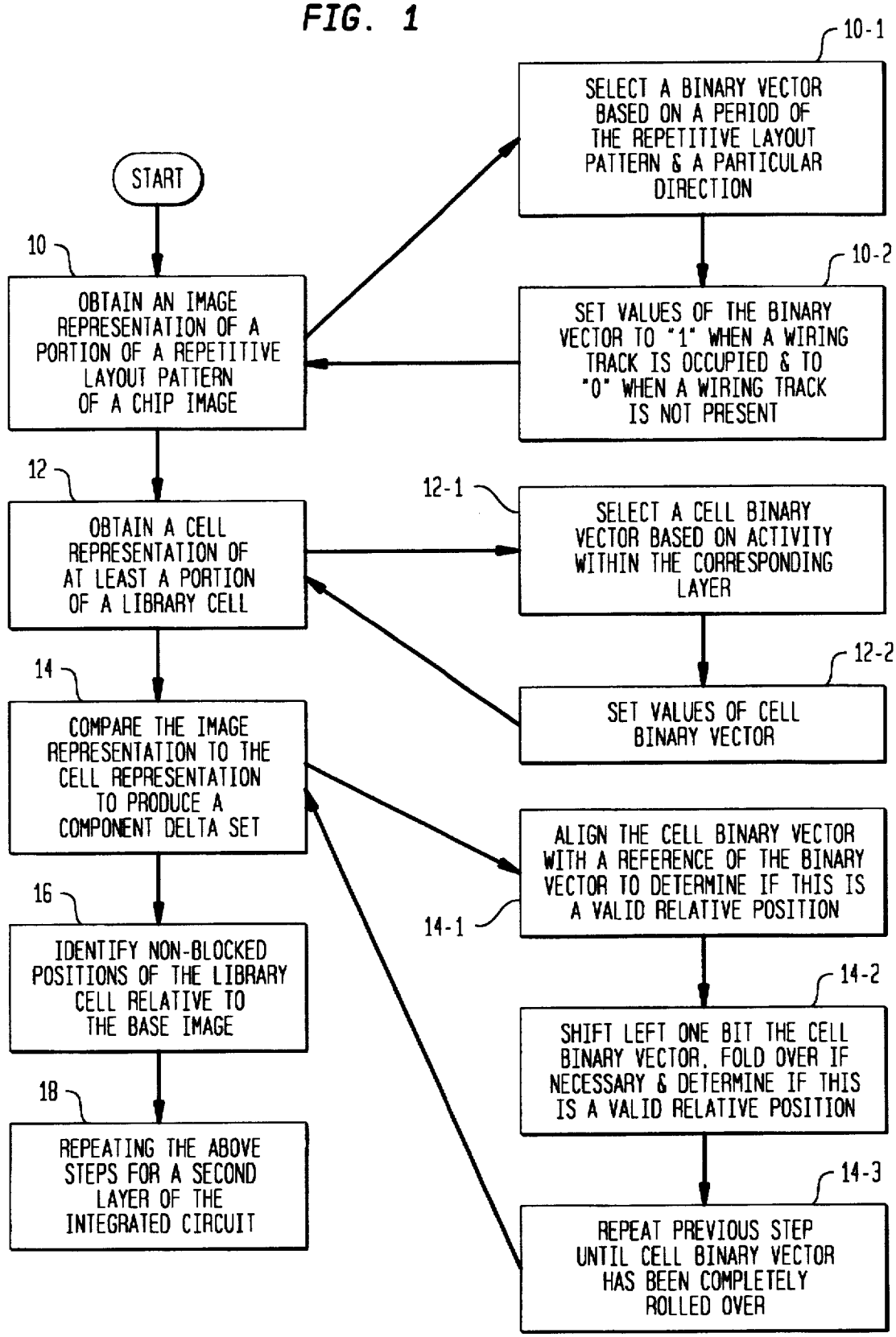
FIG. 1 illustrates a logic diagram that may be used to implement the present invention.

FIG. 1 illustrates a logic diagram that may be used to implement the spacing determination, or valid positioning of cell libraries on a chip image or hierarchical design image. Such a method may be executed by a computer and read off of any type of computer readable storage medium such as a computer disk, magnetic tape, random access memory, read only memory, any type of electronically programmable read only memory, or any type of means for storing digital information. To begin the discussion, a base image is defined to be the overall chip image or a hierarchy design image. The overall chip image is an IC's common prewiring pattern without any library cells. The hierarchy design image may be a combination of the overall chip image with library cells already positioned, or placed, on the IC layout.

The process begins at step 10 wherein an image representation of a portion of a repetitive layout pattern of a base image is obtained. The image representation, or periodic blockage vector, may be obtained by creating the image based on the particular repetitive pattern of the IC layout or a portion thereof, or may be read from memory which has previously stored the information. As an illustrative example of creating an image representation, the process may proceed to step 10-1 wherein a binary vector based on a period of the repetitive layout pattern and a particular direction is selected. The binary vector represents a grid division of the IC layout, or portion thereof, and has a length equal to the number of grid spacings in the repetitive pattern of the IC layout. The grid spacing may be in the range of a few micrometers but may be magnitudes less or magnitudes greater, depending on designer's choice. This concept will be more fully explained with reference to FIGS. 5 and 6.

Having selected the binary vector, the process proceeds to step 10-2 wherein values of the binary vector are set to a logic 1 when a wiring track is occupied and to a logic 0 when a wiring track is not occupied. A value of the binary vector is representative of a particular grid division chosen by the designer. Again, this will be more fully explained with reference to FIGS. 5 and 6.

Having obtained the image representation, the process proceeds to step 12 wherein a cell representation, or image active layer set, of at least a portion of a library cell is obtained. Similar to obtaining the image representation, the cell representation may be created based on a grid pattern laid over the cell pattern or read from memory. As an illustrative example of obtaining a cell representation, the process may proceed to step 12-1 wherein a cell binary vector based on activity within the corresponding layer is selected. The cell binary vector is representative of the grid in a particular direction wherein activity is representative of the library cell having a circuit component at a particular layer, or the corresponding layer. Having selected the cell binary vector, the values of the cell binary vector are set at step 12-2. Similar to step 10-2, the values of the cell binary vector are set to 1 when a wiring track, or activity, is occupied and to a logic 0 when a wiring track, or activity, is not occupied.

At step 14, the image representation is compared with the cell representation to produce a component delta set relative to the base image. The component delta set includes binary values that represent valid and invalid positions of a library cell with respect to the repetitive pattern of the base image. As an illustrative example of this comparison, the process may proceed to step 14-1 wherein the cell binary vector is aligned with a reference point of the base image binary vector and compared using a modulus division technique to determine whether a conflict exists for this relative positioning. If a conflict exists, the first binary value in the component delta set will be a logic "1", indicating that this is an invalid relative position of the library cell on the base image; Otherwise, the value will be set to a logic "0" indicating that this a valid relative position.

The process then proceeds to step 14-2, wherein the cell binary vector is shifted to the left one bit and folded over if necessary. Once shifted, the cell binary vector is again compared with the binary vector of the base image. If this is a valid position, a logic "0" is stored as the second bit in the component delta set; otherwise, a logic "1" is stored indicated an invalid position. The cell binary vector may need to folded over if, when aligned with the binary vector of the base image, the last bit of the cell binary vector exceeds the last bit binary vector of the base image. In this instance, the last bit is wrapped around to the first bit location of the comparison.

For example, assume that the binary vector of the base image is five bits in length B0, B1, B2, B3 and B4 and the cell binary vector is three bits in length C0, C1, and C2. Further assume that the reference point of the base image binary vector is B0. The initial alignment, as delineated in step 14-1, places C0 in line with B0, C1 in line with B1, and C2 in line with B2. Don't Care bits would be aligned with B3 and B4. When the cell binary vector is shifted to the left three times, as per step 14-3, C2 exceeds B5, the last bit of the binary vector, thus C2 would be folded over. As such, the folded cell binary vector would be C2, X, X, C0, and C1 which is compared with B0, B1, B2, B3, and B4 respectively. When the cell binary vector has been completely folded over, i.e., shifted four times, the folded cell vector will be C1, C2, X, X, and C0. Folding of the binary vectors will be discussed in greater detail with reference to FIGS. 8 and 9.

Having made the comparison, the process proceeds to step 16 wherein non-blocked positions of the library cell are identified via the component delta set. Thus, step 16 enables the placement algorithm to identify spacing problems and correct them on the fly, thus eliminating the subsequent exhaustive search of prior art techniques.

The process continues at step 18 wherein the preceding steps 10–16 are repeated for other layers of the integrated circuit. Once each layer has been checked for valid positioning of its library cells, the layout of an integrated circuit is complete with guaranteed compliance to spacing requirements. Thus, within the execution of the placement program, the present invention enables the IC designer to insure that library cell placements meet spacing requirements without the need to perform a subsequent exhaustive search.

Figure 2:
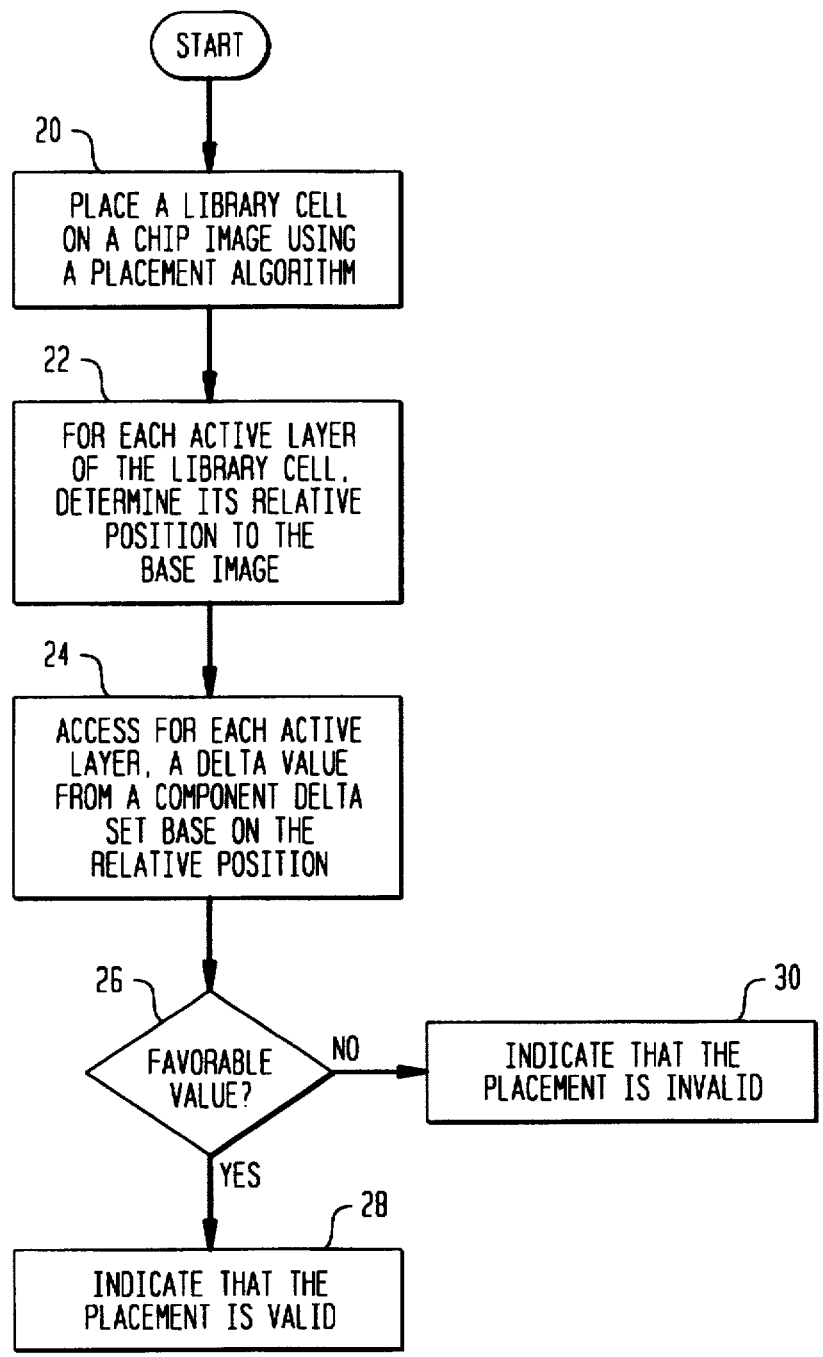
FIG. 2 illustrates an alternate logic diagram that may be used to implement the present invention.

FIG. 2 illustrates a logic diagram that illustrates a placement procedure in accordance with the present invention. The method represented by FIG. 2 may be executed by a computer when the computer reads the method from a computer readable storage medium. The computer readable storage medium may be a computer disk, a magnetic tape, a CD-ROM, random access memory, read only memory, programmable memory, or any other means for storing digital information. The process begins at step 20 wherein a library cell is placed on a base image of an integrated circuit, using a placement algorithm. The particular placement algorithm may be any known algorithm used by IC designers. Having placed a particular library cell, the process proceeds to step 22 wherein, for each active layer of the library cell, its relative position to the repetitive pattern, i.e., the binary vector, of the base image is determined. As discussed with reference to steps 14-1 through 14-3 of FIG. 1, the relative position is based on a cell binary vector of the library cell and its relationship to the reference point of the binary vector of the base image.

Having obtained the relative position, the process proceeds to step 24 wherein a delta value of a component delta set is accessed. The process then proceeds to step 26 where a determination is made as to whether the accessed delta value is a favorable value. If the accessed delta value is a favorable one, the process proceeds to step 28 wherein an indication is made that the placement is valid. If, however, the accessed delta value is not favorable, the process proceeds to step 30 where an indication is made that the placement is invalid.

Figure 3:
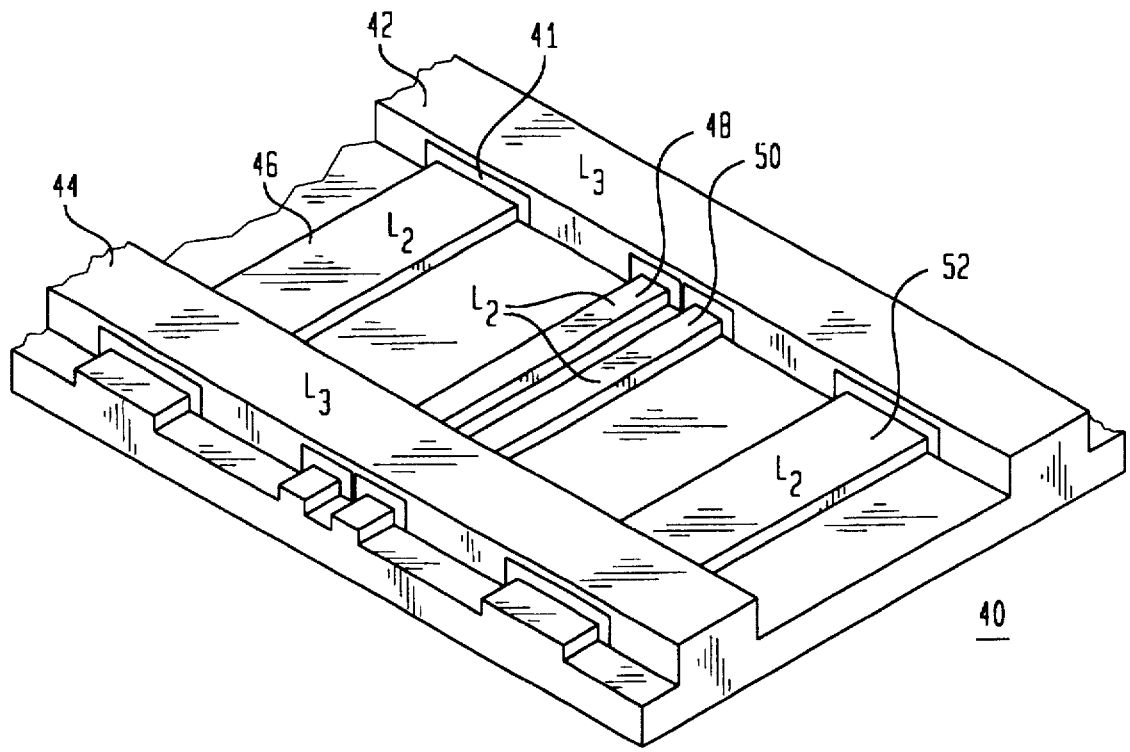
FIG. 3 illustrates an isometric view of a portion of a chip image in accordance with the present invention.

FIG. 3 illustrates an isometric view of a base image of an integrated circuit. This base image may be the chip image, a cell image, or a plurality of cell images that have been superimposed upon each other. The base image 40 is shown to include a plurality of lines at layer, or level, 2 which are represented by reference numerals 46, 48, 50, and 52, and two lines at layer, or level, 3 which are represented by reference numerals 42 and 44. As shown, the traces at layer 3, 42, 44, are higher than traces at layer 2, 46, 48, 50, 52. The elevated layers may be done by etching or depositing techniques which are known in the art and are electrically isolated by insulation 41.

Figure 4:
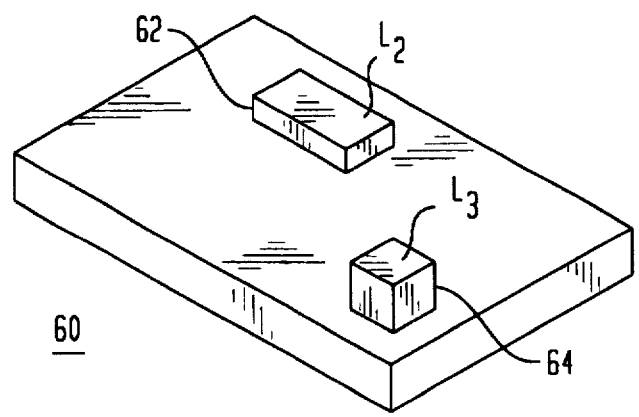
FIG. 4 illustrates an isometric view of a library cell in accordance with the present invention.

FIG. 4 illustrates an isometric view of a library cell 60 that includes a circuit component at level 2, 62, and a circuit component at level 3, 64. As one skilled in the art will readily appreciate, the isometric views of FIGS. 3 and 4 are merely illustrative examples of a library cell and a base image, and, as such, the library cell and/or the base image may have more or less layers, depending on the type of integrated circuit being designed.

Figure 5:
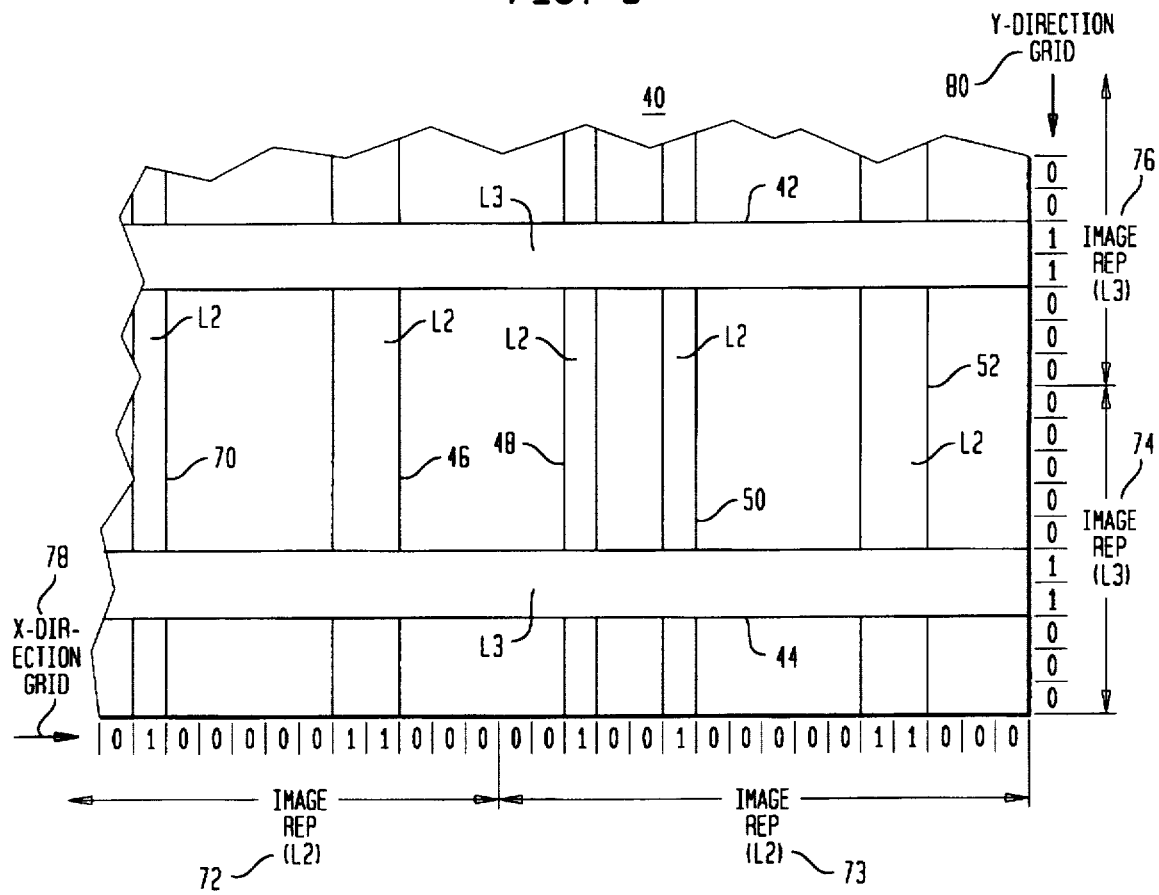
FIG. 5 illustrates a planer view of the portion of the chip image of FIG. 3 having an X-Y grid in accordance with the present invention.

FIG. 5 illustrates a planer view of the base image 40 having an X grid 78 and a Y grid 80 superimposed thereon. The X grid 78 comprises a plurality of equally spaced segments, wherein the distance between the segments is determined by the IC designer or by a particular manufacturer based on technology constraints. Such spacing is typically in the range of a micrometer to a few micrometers but may be magnitudes greater or less. The X direction grid 78 spacing is used to generate the image representation 72, 73 which correspond to the second layer. As shown, the image representation 72, 73 comprise the same binary vector which is representative of the repetitive pattern of the base image. As shown, the binary vector of image representations 72, 73 is 16 bits in length and is represented as 0001 1000 0010 0100.

Similarly, the repetitive pattern in the Y-direction is represented by image representation 74, 76, which comprises a binary vector having 10 bits, or values, and is shown to be 00011 00000. Note that there is no corresponding image representation for the third layer in the X direction, since the prewiring on the third level extends throughout the particular base image 40. Likewise, there is no Y direction image representation for traces, or prewiring elements, on layer 2 of the base image 40.

Figure 6:
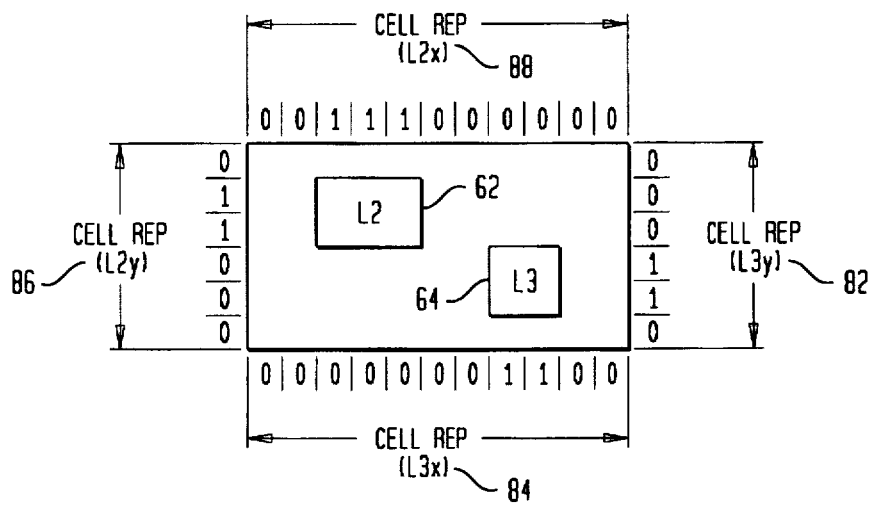
FIG. 6 illustrates a planer view of the library cell of FIG. 4 with an X-Y grid in accordance with the present invention.

FIG. 6 illustrates the library cell 60 which has an X direction grid and a Y direction grid superimposed upon it to produce a plurality of cell representations 82, 84, 86, and 88. The cell representation 82, which is represented by a binary value in the Y direction, includes six values and has the binary number of 011000. Similarly, the cell representation for layer 2 in the Y direction 86 includes six values but has the binary value of 000110. The cell representation for layer 3 in the X direction 84 has 11 values and binary number of 00110000000. Likewise, the cell representation for layer 2 in the X direction 88 has 11 values but a binary number of 00000011100.

The X and Y grid images of the library cell 60 and the base image 40 and the corresponding binary vectors may be provided to the IC designer by an IC manufacturer as part of an IC design tool kit. Thus, the IC designer can test for valid spacing on the fly while the placement program is being run, or store the resulting information and used to subsequently verify spacing.

Figure 7:
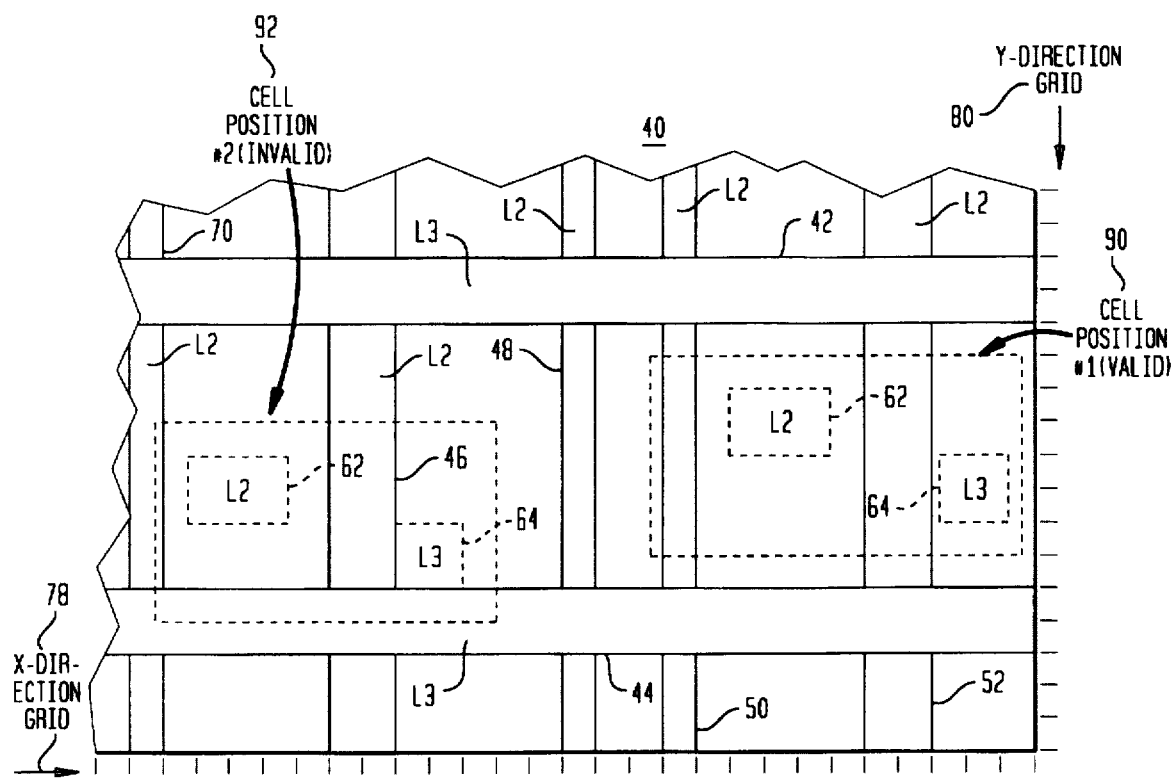
FIG. 7 illustrates a planer view of the chip image with the library cell placed in valid and invalid positions in accordance with the present invention.

FIG. 7 illustrates the planer view of the library cell 60 of FIG. 6 being placed in two locations on the base image 40 of FIG. 5. As shown, the library cell 60 has been positioned in two places, cell position 1, 90, and cell position 2, 92. As also shown, cell position 1, 90, is a valid placement, while cell position 2, 92, is an invalid placement. Cell position 1, 90, is valid, because the circuit components of the library cell which are deposited on layers 2 and 3 do not violate the spacing requirements of this particular layout. For ease of illustration, the spacing requirements are representative of one grid spacing in either the X direction or the Y direction. Thus, as shown, the cell position 1, 90, has at least one grid spacing between the components of the library cell on layer 2 with the traces of the base image 40 of layer 2. Likewise, the circuit components of the library cell that reside on layer 3 are at least one grid spacing away from the layer 3 components of the base image. As further shown, the components of the library cell on layer 3 are adjacent to the layer 2 components of the base image, however, this complies with spacing requirement because the components are on different layers.

Cell placement 2, 92, is an invalid placement. It's invalid because the circuit components which reside on level 3, 64, of the library cell are within a grid spacing of the components on layer 3 of the base image. A similar violation could occur if the circuit components of the library cell on layer 2, 62, were within one grid spacing of any layer 2 components of the base image.

FIG. 8 illustrates the mathematical computations for determining a component delta set 128 for the library cell 60 in the Y-direction. In the Y-direction, only layer 3 is applicable because of the continuous tracks in the second layer (i.e., layer 2 is continuous in the Y-direction). The image representation 74 or 76 is shown as the binary number 00011 00000. The first bit of the image representation is considered to be the reference point 100, but as one skilled in the art would readily appreciate, any bit location could be used as the reference point. The cell representation 82 is shown aligned with the image representation 74, wherein the first bit of the cell representation corresponds to the first bit of the image representation. As shown, the image representation has 10 bits, while the cell representation has only six bits. Thus, four don't care bits 104 are added to the cell representation. In practice, the don't care bits should be reflective of a non-conflicting situation, i.e., they should be a logic "0", but are shown as an "X" for illustrative purposes.

With this alignment, the cell representation 82 is compared with the image representation to determine a first value 106 of the component delta set 128. Such a comparison may be done in a variety of ways to identify a conflict 102. For example, modulus division, a bit comparison, etc. would provide the desired comparative results. As shown, when the cell representation is in this relative position to the image representation, a conflict exists, such that the first value 106 is set to a logic "1".

Having made this first comparison, the cell representation is shifted one bit to the left as shown by the shifted cell representation 108. Once shifted, the cell representation is compared to the image representation to produce a corresponding value 107 of the component delta set (CDS) 128. In this relative position 108, a conflict exists such that the value 107 is set to a logic "1". The cell representation is again shifted to the left to produce the cell representation 110 which is subsequently compared to the image representation. The resulting value 107 for this relative position 110 is a logic "1" indicating a conflict. Likewise, relative positions 112 and 114 are in conflict with the image representation.

As shown, relative positions 116 through 124 are not in conflict with the image representation and, as such, the corresponding value 107 is set to a logic "0". At relative position 116, the cell binary vector of the cell representation is folded over 126. In other words, the cell binary vector has wrapped around such that the last real bit (not including the don't care bits) is now the first bit in the shifted cell representation.

Once the cell representation has been completed folded over (i.e., one more shift results in the original cell representation), the component delta set 128 for this library set for this layer is created. As shown, the component delta set 128 has a binary value of 11111 00000. These values indicate, with respect to the reference point 130, whether a library cell relative positioning is valid. For example, any relative placement of the library cell where the first bit of the cell representation corresponds to any of the first five bits of the image representation would be an invalid position. Conversely, any relative positioning of the cell representation corresponding to the last five bits would be a valid placement.

As one skilled in the art will readily appreciate, the shifting technique could be to the right, or any other shifting technique. Additionally, the pattern represented by the image representation may be repeated multiple times on the chip image and a library cell may be placed several times.

FIG. 9 illustrates the generation of the component delta set 140 for the library cell in the X-direction, where only layer two is applicable. As shown, the image representation 72 or 73 is a sixteen bit binary vector, wherein the first bit is designated as the reference bit 100. As with the illustration of FIG. 8, the cell representation 88 is compared with the image representation, subsequently shifted one bit to the left and compared again. For the original cell representation 88 (unshifted), a corresponding value 134 of the component delta set (CDS) is set to a logic "0", indicating that this is a valid position. The next eight relative positions 136 are invalid and have a corresponding value 134 of a logic "1".

The next relative position 137, which is representative of the ninth shift, is a valid position of the library cell. The remaining relative positions 139 are invalid positions. Thus, the resulting component delta set 140 is 0111 1111 1011 1111. From this component delta set, the validity of the library cell position can readily be determined based on the relative start position to reference point 138 value. As indicated, the only valid positions are the zeroth and the ninth. A computer can quickly determine the relative position of a library cell to the repetitive pattern of the base image and, by using the component delta set, determine whether the position is valid.

The present invention, as described above, provides a method and apparatus for insuring proper spacing of placed library cells on an integrated circuit layout. By using the present invention in conjunction with a placement algorithm, the placement algorithm can, on the fly, determine whether all spacing requirements are met. Such a feature allows an IC designer to eliminate the time-consuming exhaustive search routine that was performed subsequent to the placement algorithm.

What is claimed is:

1. A method for detecting prewire blockage of a library cell on an integrated circuit layout, the method comprising the steps of:
    a) for a particular layer of the integrated circuit, obtaining an image representation of a portion of a repetitive layout pattern of a base image including wiring tracks;
    b) obtaining a cell representation of at least a portion of the library cell for a corresponding layer to the particular layer;
    c) comparing the cell representation with the image representation to produce a component delta set, wherein the component delta set includes a representation of valid relative positioning of the library cell within the repetitive layout pattern, wherein step (c) further comprises the steps of (i) aligning a cell binary vector of the cell representation with a reference point of the base image binary vector to determine whether a conflict exists, (ii) when a conflict exists, setting a corresponding value of the component delta set to a first logic state, (iii) when a conflict does not exist, setting the corresponding value of the component delta set to a second logic state, and (iv) shifting the cell binary vector to determine whether a second conflict exists at a different relative position to the reference point; and
    d) identifying non-blocked position of the library cell on the base image based on the component delta set.

2. The method of claim 1, wherein step (a) further comprises the steps of:
    selecting a base image binary vector as the image representation based on a period of the repetitive layout pattern of the base image and a particular direction of the wiring tracks; and
    setting values of the base image binary vector based on the wiring tracks within the particular layer.

3. The method of claim 2, wherein the step of setting values of the base image binary vector further comprises the steps of:
    setting a particular value of the base image binary vector to a logic one when, in the particular direction, a wiring track of the wiring tracks is occupied; and
    setting another particular value of the base image binary vector to a logic zero when, in the particular direction, one of the wiring tracks is not occupied.

4. The method of claim 2, wherein step (b) further comprises the steps of:
    selecting a cell binary vector as the cell representation based on activity within the corresponding layer; and
    setting values of the cell binary vector based on active layer areas of the at least a portion of the library cell.

5. The method of claim 1, further comprising the steps of:
    for a second layer of the integrated circuit, obtaining a second image representation of a portion of a repetitive layout pattern of the base image including wiring tracks;
    obtaining a second cell representation of at least a portion of the library cell for a corresponding layer to the second layer;
    comparing the second cell representation with the second image representation to produce a second component delta set, wherein the second component delta set includes a second representation of valid relative positioning of the library cell within the repetitive layout pattern of the second layer; and
    identifying second non-blocked positions of the library cell on the base image based on the second component delta set.

6. A computer readable storage medium for storing program instructions, that, when read by a computer, causes the computer to detect prewire blockages of a library cell on an integrated circuit layout, the computer readable storage medium comprising:
    first storage means for storing program instructions that cause the computer, for a particular layer of the integrated circuit, to obtain an image representation of a portion of a repetitive layout pattern of a base image including wiring tracks;
    second storage means for storing program instructions that cause the computer to obtain a cell representation of at least a portion of the library cell for a corresponding layer to the particular layer;

third storage means for storing program instructions that cause the computer to compare the cell representation with image representation to produce a component delta set, wherein the component delta set includes a representation of valid relative positioning of the library cell within the layout pattern, wherein the third storage means further comprises the functions of (i) storing program instructions that cause the computer to align a cell binary vector of the cell representation with a reference point of the base image binary vector to determine whether a conflict exists (ii) storing program instructions that cause the computer, when a conflict exists, to set a corresponding value of the component delta set to a first logic state (iii) storing program instructions that cause the computer, when a conflict does not exist to set the corresponding value of the component delta set to a second logic state, and (iv) storing program instructions that cause the computer to shift the cell binary vector to determine whether a second conflict exists at a different relative position to the reference point; and fourth storage means for storing program instructions that cause the computer to identify non-blocked positions of the library cell on the base image based on the component delta set.

7. The computer readable storage medium of claim 6, wherein the first storage means further comprises the functions of:

storing program instructions that cause the computer to select a base image binary vector as the image representation based on a period of the repetitive layout pattern of the base image and a particular direction of the wiring tracks; and storing program instructions that cause the computer to set values of the base image binary vector based on the wiring tracks within the particular layer.

8. The computer readable storage medium of claim 7, wherein the first storage means further comprises the function of:

storing program instructions that cause the computer to set a particular value of the base image binary vector to a logic one when, in the particular direction, a wiring track of the wiring tracks is occupied; and storing program instructions that cause the computer to set another particular value of the base image binary vector to a logic zero when, in the particular direction, one of the wiring tracks is not occupied.

9. The computer readable storage medium of claim 7, wherein the second storage means further comprises the function of:

storing program instructions that cause the computer to select a cell binary vector as the cell representation based on activity within the corresponding layer; and storing program instructions that cause the computer to set values of the cell binary vector based on active layer areas of the at least a portion of the library cell.

10. The computer readable storage medium of claim 7, further comprising:

fifth storage means for storing program instructions that cause the computer to, for a second layer of the integrated circuit, obtain a second image representation of a portion of a repetitive layout pattern of the base image including wiring tracks;

sixth storage means for storing program instructions that cause the computer to obtain a second cell representation of at least a portion of the library cell for a corresponding layer to the second layer;

seventh storage means for storing program instructions that cause the computer to compare the second cell representation with the second image representation to produce a second component delta set, wherein the second component delta set includes a second representation of valid relative positioning of the library cell within the repetitive layout pattern of the second layer; and eighth storage means for storing program instructions that cause the computer to identify second non-blocked positions of the library cell on the base image based on the second component delta set.

11. A method for placing library cells on a base of an integrated circuit, the method comprising the steps of:

a) placing a library cell in a particular position on the base image using a placement algorithm;

b) for each active layer of the library cell, determining a relative position of a corresponding active layer cell representation of the library cell to an image representation of a portion of a repetitive layout pattern of the base image including wiring tracks;

c) for each active layer of the library cell, accessing a delta value from a component delta set based on the relative position, the component delta set having been produced by comparing the cell representation with the corresponding image representation for each active layer, wherein step (c) further comprises the steps of (i) aligning a cell binary vector of the cell representation with a reference point of the base image binary vector to determine whether a conflict exists, (ii) when a conflict exists, setting a corresponding value of the component delta set to a first logic state, (iii) when a conflict does not exist, setting the corresponding value of the component delta set to a second logic state, and (iv) shifting the cell binary vector to determine whether a second conflict exists at a different relative position to the reference point; and d) when the delta value is favorable, indicating that the particular position is valid.

12. The method of claim 11, wherein step (b) further comprises the steps of:

determining which layers of the base image are represented by periodic blockage vectors, wherein a periodic blockage vector includes an image representation based upon a particular repetitive pattern of a layout of the integrated circuit; and determining whether the library cell is active in the layers of the base image represented by the periodic blockage vectors to identify each active layer of the library cell.

13. The method of claim 11, wherein step (d) further comprises the step of:

determining that the delta value is favorable when the delta value is set to a logic state indicative of a valid relative position.

14. A computer readable storage medium for storing program instructions that, when read by a computer, causes the computer to place library cells on a base image of an integrated circuit, the computer readable storage medium comprising:

first storage means for storing a placement algorithm that includes program instructions that cause the computer to place a library cell in a particular position on the base image;

second storage means for storing program instructions that cause the computer to, for each active layer of the library cell, determine a relative position of a corresponding active layer cell representation of the library cell to an image representation of a portion of a repetitive layout pattern of the base image wiring tracks;

third storage means for storing program instructions that cause the computer, for each active layer of the library cell, to access a delta value from a component delta set based on the relative position, the component delta set having been produced by comparing the cell representation with the corresponding image representation for each active layer, wherein the third storage means further comprises the functions of (i) storing program instructions that cause the computer to align a cell binary vector of the cell representation with a reference point of the base image binary vector to determine whether a conflict exists, (ii) storing program instructions that cause the computer, when a conflict exists, to set a corresponding value of the component delta set to a first logic state, (iii) storing program instructions that cause the computer, when a conflict does not exist, to set the corresponding value of the component delta set to a second logic state, and (iv) storing program instructions that cause the computer to shift the cell binary vector to determine whether a second conflict exists at a different relative position to the reference point; and fourth storage means for storing program instructions that cause the computer, when the delta value is favorable, to indicate that the particular position is valid.

15. The computer readable storage medium of claim 14, wherein the second storage means further comprises the functions of:

storing program instructions that cause the computer to determine which layers of the base image are represented by periodic blockage vectors, wherein a periodic blockage vector includes an image representation based upon a particular repetitive pattern of a layout of the integrated circuit; and storing program instructions that cause the computer to determine whether the library cell is active in the layers of the base image represented by the periodic blockage vectors to identify each active layer of the library cell.

16. The computer readable storage medium of claim 14, wherein the fourth storage means further comprise the functions of:

storing program instructions that cause the computer to determine that the delta value is favorable when the delta value is set to a logic state indicative of a valid relative position.

17. The method of claim 11, further comprising the steps of:

generating the image representation of the base image of the integrated circuit, including:

a1) determining an X and Y grid pattern for the integrated circuit base image, the integrated circuit base image including active layers;

b1) determining, for each active layer of the integrated circuit base image, a base image binary vector in at least one of an X direction or a Y direction of the X and Y grid pattern;

c1) storing, for each active layer of the integrated circuit image, the base image binary vector and whether it is for the X direction or the Y direction.

18. The method of claim 17, wherein step (a) further comprising the step of:

determining the X and Y grid pattern for the integrated circuit base image, wherein the integrated circuit is at least one of the following selected from the group consisting of a chip image, a library cell, an and hierarchy design image.

* * * * *